United States Patent [19]
Epworth et al.

[11] Patent Number: 5,777,773
[45] Date of Patent: Jul. 7, 1998

[54] OPTICAL FREQUENCY CONTROL SYSTEM AND METHOD

[75] Inventors: Richard Epworth, Sawbridgeworth; Duncan John Forbes, Bishops Stortford, both of United Kingdom

[73] Assignee: Northern Telecom Limited, Montreal, Canada

[21] Appl. No.: 741,587

[22] Filed: Oct. 31, 1996

[51] Int. Cl.[6] ............................................ H04B 10/04
[52] U.S. Cl. .................. 359/182; 359/181; 359/187; 372/32
[58] Field of Search ............................. 359/110, 124, 359/181–182, 161, 187; 372/31–32

[56] References Cited

U.S. PATENT DOCUMENTS

| | | | |
|---|---|---|---|
| 5,347,392 | 9/1994 | Chen et al. | 359/279 |
| 5,373,385 | 12/1994 | Darcie et al. | 359/162 |
| 5,510,922 | 4/1996 | Naito | 359/124 |

OTHER PUBLICATIONS

Rev. Sci. Instrum. 61(9) Sep. 1990 pp. 2478–2480 "Frequency Stabilization of a Directly Modulated Laser" by Lee et al.

*Primary Examiner*—Kinfe-Michael Negash
*Attorney, Agent, or Firm*—W. Glen Johnson; John D. Crane

[57] ABSTRACT

Method and apparatus for controlling the frequency of a laser in an optical transmission system which involves applying a frequency modulation to the laser, determining an amplitude modulation present in the signal downstream of the laser and attributable to the frequency modulation, and discriminating a portion of the amplitude modulation which is substantially in phase quadrature with the applied frequency modulation. The frequency of the laser is controlled on the basis of the discriminated quadrature portion. An optical component downstream of the laser may have a response which converts FM to AM. The response and the frequency output of the laser can be locked to one another, without errors caused by unwanted AM in the transmitted signal modulation frequency.

25 Claims, 9 Drawing Sheets

OPTICAL FREQUENCY CONTROL SYSTEM AND METHOD

FIELD OF THE INVENTION

This invention relates to control systems for controlling the frequency of a laser, control systems for controlling the frequency response of an optical component, methods of controlling the frequency of a laser, methods of controlling the frequency response of a optical component, signal processing systems, and signal processing methods in optical transmission systems.

BACKGROUND TO THE INVENTION

It is known from U.S. Pat. No. 5,347,392 to lock the response of a tuneable resonant cavity modulator by dithering the cavity and monitoring the fluctuation of output intensity as the cavity is switched. The locking scheme can also be applied using only the random data sequence, without additional dithering.

It is known to provide a dither signal at low frequencies superimposed on a transmitted optical signal for various purposes, including monitoring of noise, or suppression of stimulated Brillouin scattering (SBS). U.S. Pat. No. 5,373,385 (Darcie, and Woodward) discloses frequency modulating the optical carrier signal with a low frequency dither. The frequency modulation is operable to reduce stimulated Brillouin scattering in the optical transmission system, and noise caused by multi-path interference will decrease.

In principle, when it is desired to use a dither signal to lock a particular narrow band optical component such as a passive frequency reference, or a chromatic dispersion compensator to the operating wavelength of the transmitted signal, the dither can be applied either to the optical component, to vary its response with respect to frequency, or the dither can be applied upstream of the component, for example by direct modulation of the laser source.

If a small modulation current is applied to the laser, causing the optical amplitude to be modulated, (and also causing frequency modulation) when this frequency dithered signal is passed through a narrow band device, the slope of the response with respect to frequency, results in demodulation of the FM to AM. As the relative alignment between the laser output frequency and the response curve of the narrow band device is changed, there is demodulation of FM to AM where there is a finite slope. The steeper the slope the larger the demodulated FM. Typically, with a sinusoidal dither modulation, a system can be made to lock to the centre of a narrow band component simply by synchronously detecting the demodulated signal and locking to the condition of zero fundamental. This achieved by synchronously detecting the portion of the monitored signal which is in phase with the applied dither modulation signal. The output frequency of the laser, or the response of the narrow band component can then be adjusted so as to drive the detected error signal which is in phase with the dither modulation signal, towards zero.

Driving the error towards zero achieves locking to the peak of the narrow band component response curve.

FIG. 1 shows a schematic block diagram of a known optical transmission system. A laser 1 generates an optical output which is fed to an external modulator 2, and subsequently to a narrow band filter 3. The laser output is controlled by controlling its temperature, and by controlling the laser current. The laser temperature and/or bias current is controlled by means of a feed-back loop. In the feedback loop are an optical to electrical converter, with a low-pass filtering function 4, and a phase sensitive comparator 5, which compares the monitored output of the narrow band filter 3 with a signal representing the dither modulation applied to the laser. A dither generator 6 is shown for generating a suitable dither for direct modulation of the laser by modulating the laser current.

The phase sensitive comparator 5 is operable to detect portions of the monitored signal from the output of the narrow band filter 3 which are in phase with the output of the dither generator 6. An error signal representing the amplitude of the dither appearing at the output of the narrow band filter 3 is fed back to a compensation generator 7 which controls the laser temperature and/or bias current, and thus the laser output frequency. The error signal at the output of the phase sensitive comparator 5 represents the slope of the response of the filter 3 at the laser operating frequency. The compensation generator 7 is operable to adjust the temperature and/or bias current of the laser, and thus the frequency of its output, so as to reduce the error signal to zero by moving the laser output frequency to a point on the filter response curve where the slope is zero, i.e. the peak of the response curve.

One example of frequency stabilisation of a laser uses direct modulation of the injection current to give 50 MHz of frequency modulation on the output, which is then fed through a Fabry-Perot etalon. The injection current is then controlled on the basis of a frequency error signal to lock the laser frequency to the resonant frequency of the etalon. This is shown in Rev. Sci. Instrum. 61(9) Sep. 1990 p2478–2480, "Frequency Stabilisation of a Directly Modulated Laser" by Lee et al.

FIG. 2 shows a similar arrangement to that of FIG. 1, in which the error signal is fed to a response control means 8 which controls the frequency of the peak of a tuneable filter 23, so as to maintain the peak frequency in alignment with the laser output frequency.

One source of inaccuracy in these control systems, and in any noise monitoring or other monitoring system which relies on detecting the amplitude of dither downstream of a dither source, is that other sources of amplitude modulation at the same frequency as the dither can arise. In particular, most semi-conductor lasers when directly modulated, do not only generate FM, but also generate some AM. This introduces an error which means that in the control systems discussed above, there will a residual error in alignment, since there will be zero error at a point where there is enough slope in the response for the demodulated FM to cancel out the laser generated AM. If the generated AM is greater than the maximum demodulated FM, where the slope is at its steepest, then the control system may not achieve locking.

Where the dither is used for monitoring purposes rather than control, the AM generated by the laser will produce a steady error in the monitored results.

SUMMARY OF THE INVENTION

The invention aims to provide improved methods and systems.

According to a first aspect of the invention, there is provided control system for controlling the frequency of a laser in an optical transmission system in which the optical output of the laser is passed through an optical component whose output amplitude is dependent on input frequency and input amplitude, the control system comprising:

means for applying a modulation to the laser which produces frequency modulation and amplitude modulation in an optical output of the laser;

means for detecting an amplitude modulation present at the output of the component;

means for determining a portion of the detected amplitude modulation which is substantially in phase quadrature with the amplitude modulation in the optical output of the laser; and means for controlling the frequency of the laser on the basis of the quadrature portion.

This aspect of the invention is based on the insight that although the laser modulation produces both amplitude and frequency modulation, the phase of the FM modulation varies with modulation frequency. In contrast, the generated AM displays negligible phase difference with frequency. Thus across a wide range of frequencies, there is a component of the FM modulation output of the laser which is in quadrature with the "unwanted" AM portion output as a result of the modulation by the dither. By applying modulation to the laser at a frequency in this range, and by detecting only this quadrature component, errors in the detected dither amplitude caused by unwanted AM can be reduced or removed.

This is particularly useful where the amount of unwanted AM varies. The amount generated by the laser for example is variable both from device to device, and over time, and therefore it is difficult to compensate for it unless it is removed from the detected dither amplitude.

In a preferred embodiment, the laser amplitude modulation is applied by direct modulation of the laser current. Advantageously, the component is a narrow band filter.

An advantageous feature is the provision of means for phase sensitive comparison of the laser amplitude modulation and the detected amplitude modulation. This enables the portion of the detected modulation attributable to the laser modulation to be separated from other portions.

Another preferred feature is a means for phase shifting a signal representating the laser amplitude modulation or the detected amplitude modulation relative to the other, before input to the phase sensitive comparison. This is a preferred way of obtaining the portion which is substantially in phase quadrature with the laser modulation.

Another preferred feature is the provision of a dither oscillator operable to output a quadrature signal for input to the phase sensitive comparison means, to achieve the phase shift. This has the advantage that the phase shift means can be dispensed with, which can simplify the arrangement. Another preferred feature is a means for extracting a selected frequency band, and discriminating the quadrature portion from the selected frequency band. This is particularly useful where the laser modulation covers a range of frequencies. The phase sensitive comparison means is likely to achieve better results if it is operating over a limited range of frequencies. The frequency selection filter can be located on either of the inputs to the phase sensitive comparison means, or on both inputs.

Another preferred feature is the provision of means for determining which parts of the input signal are rejected by the component, rather than monitoring the parts which are passed. This can provide improved bandwidth, for the control loop, particularly where the component is a narrow band filter which is arranged to reject more of the signal power than it passes. If the component is a three port filter, the rejected signal can be measured directly.

Advantageously the frequency of the laser modulation is determined so as to maximise the detected portion which is in phase quadrature with the laser amplitude modulation. This will have the effect of minimising noise in the control loop. Thus accuracy of detection of the laser modulation is enhanced.

Advantageously the control means is operable to maintain a constant relationship between the frequency of the laser and the frequency response of the component. This locking of one element to another is a particularly advantageous application of the present invention.

According to another aspect of the invention, there is provided a control system for controlling the frequency response of an optical component downstream of a laser in an optical transmission system, an output amplitude of the component being dependent on input amplitude and input frequency, the control system comprising:

means for applying a modulation to the laser which produces frequency modulation and amplitude modulation in an optical output of the laser;

means for detecting an amplitude modulation present at the output of the component;

means for determining a portion of the detected amplitude modulation which is substantially in phase quadrature with the amplitude modulation in the optical output of the laser; and means for controlling the frequency response of the component on the basis of the quadrature portion.

According to another aspect of the invention, there is provided a method of controlling the frequency of a laser in an optical transmission system in which the optical output of the laser is passed through an optical component having an output amplitude dependent on input frequency and input amplitude, the method comprising the steps of:

applying a modulation to the laser which produces frequency modulation and amplitude modulation in an optical output of the laser;

detecting an amplitude modulation present at the output of the component;

determining a portion of the amplitude modulation which is substantially in phase quadrature with the amplitude modulation in the optical output of the laser; and controlling the frequency of the laser on the basis of the quadrature portion.

According to another aspect of the invention, there is provided a method of controlling the frequency response of an optical component downstream of a laser in an optical transmission system, wherein an output amplitude of the component is dependent on input frequency and input amplitude, the method comprising the steps of:

applying a modulation to the laser which produces frequency modulation and amplitude modulation in an optical output of the laser;

detecting an amplitude modulation present at the output of the component;

determining a portion of the amplitude modulation which is substantially in phase quadrature with the amplitude modulation in the optical output of the laser; and controlling the frequency response of the component on the basis of the discriminated portion.

According to another aspect of the invention, there is provided a method of controlling the frequency response of an optical component downstream of a laser in an optical transmission system, comprising the steps of:

applying a frequency modulation to the laser output;

determining an amplitude modulation present in a signal downstream of the component and attributable to the applied frequency modulation;

discriminating a portion of the amplitude modulation which is substantially in phase quadrature with the frequency modulation; and controlling the frequency response of the component on the basis of the discriminated portion.

According to another aspect of the invention, there is provided a method of processing a signal downstream of a laser in an optical transmission system, to determine the effect of a frequency modulation applied to the laser output, the method comprising the steps of:

determining the amplitude modulation present in the signal and attributable to the applied frequency modulation; and determining a portion of the amplitude modulation which is substantially in phase quadrature with the applied frequency modulation.

Preferred features may be combined and combined with any aspect of the invention as would be apparent to a skilled person.

BRIEF DESCRIPTION OF THE DRAWINGS

For better understanding of the invention, and to show by way of example how the same maybe carried into effect, embodiments of the invention will now be described, with reference to the drawings, in which.

DETAILED DESCRIPTION OF THE PREFERRED EMBODIMENTS

Figure 1:
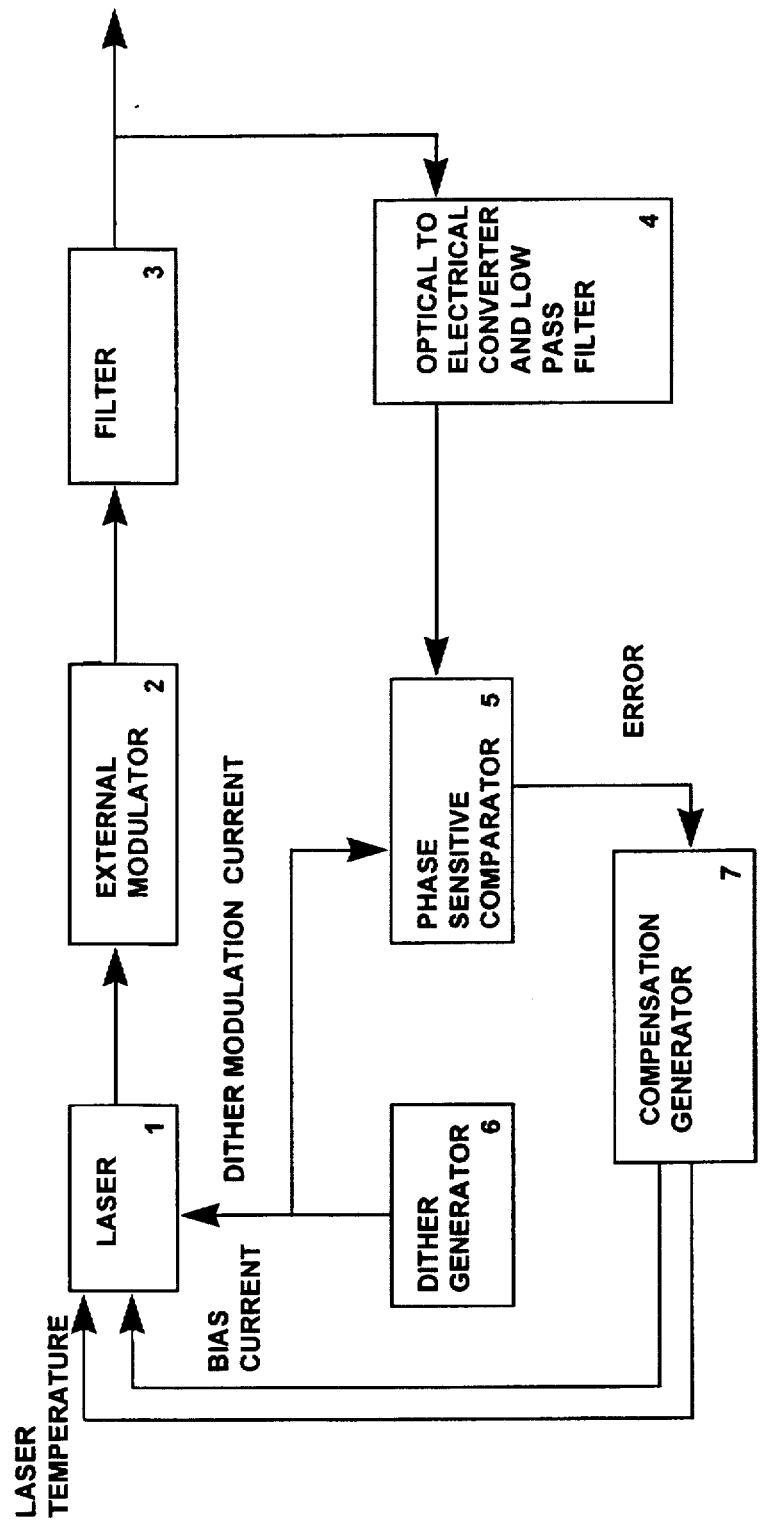
FIG. 1 shows a schematic diagram of a known optical transmission system incorporating control of laser frequency.
Figure 2:
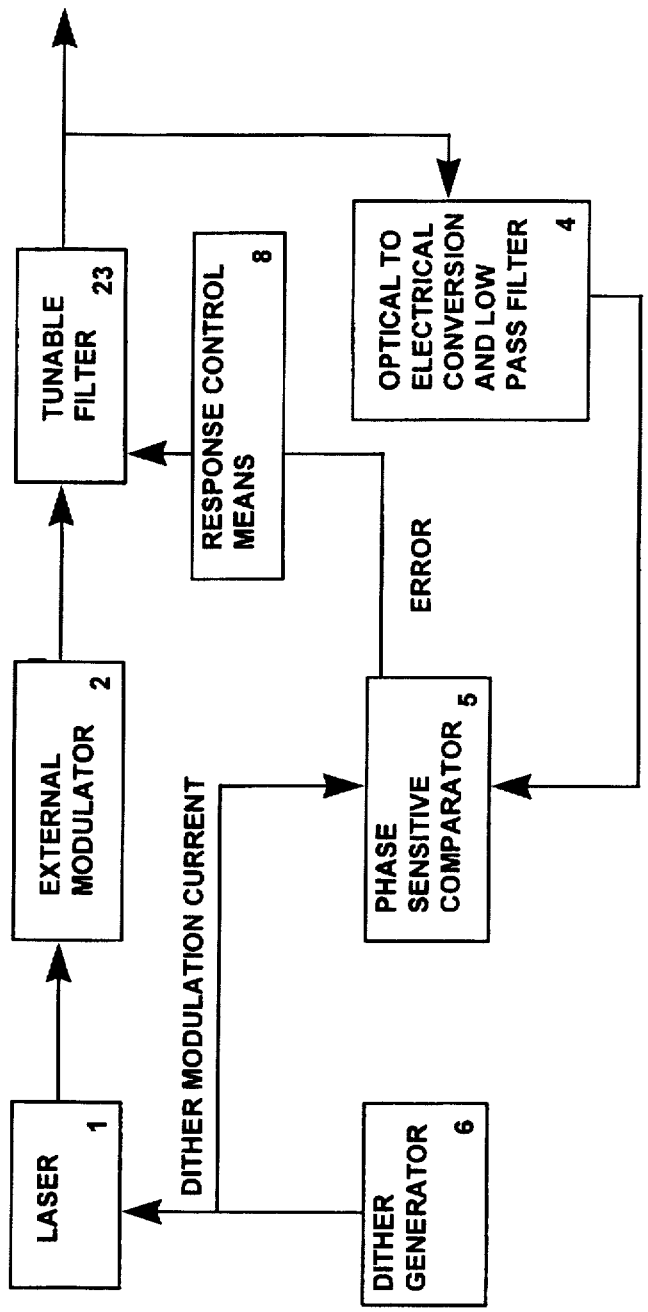
FIG. 2 shows a similar optical transmission system in which the response of a tuneable filter is controlled.
Figure 3:
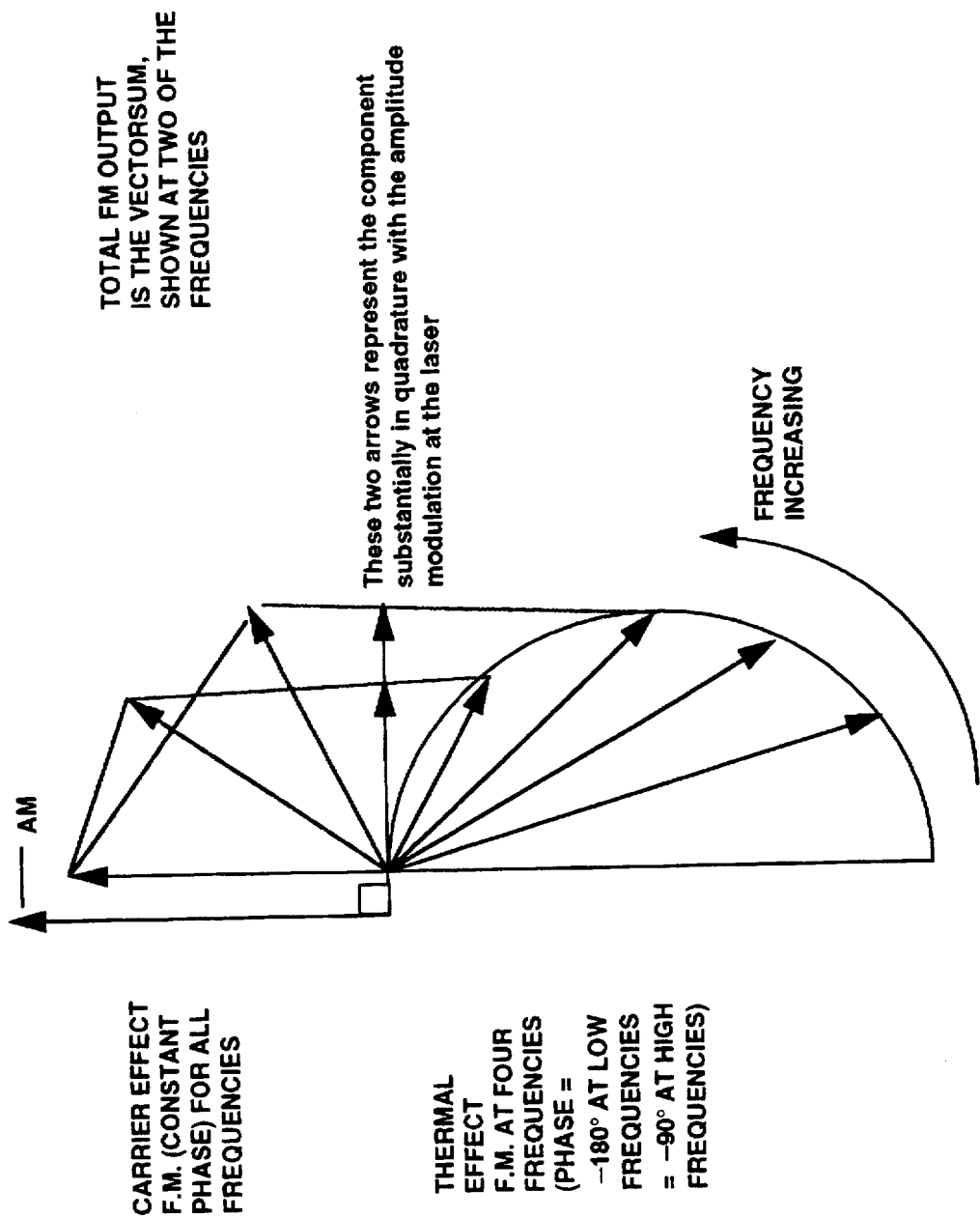
FIG. 3 shows a phase diagram demonstrating how the vector sum of the frequency modulation output by the laser will vary with frequency.

With reference to FIG. 3, an improved arrangement will be described, in accordance with the invention, which exploits the insight that the phase of the FM modulation (relative to the applied modulation current and the resulting amplitude modulation) varies with modulation frequency. Semi-conductor lasers generally exhibit negligible phase difference between the applied current modulation and the optical output intensity (amplitude modulation), from DC to high frequencies. This enables them to be used with direct modulation at quite high data rates, and with data patterns with spectral components down to DC. In contrast, the frequency modulation characteristic varies across the information bandwidth. At medium to high frequencies (e.g. 10 MHz to 1 GHz), the optical frequency increases with drive current, due to the dominant effect of the reduced refractive index resulting from the increased density of holes. This carrier effect FM is usually the dominant chirp mechanism in directly modulated lasers.

At DC and low frequencies, another FM mechanism, caused by the thermal expansion of the laser causes the frequency to decrease with drive current. Owing to thermal inertia, at higher frequencies, this effect rolls off, and the phase changes in phase. At low frequencies, the two effects are therefore in anti-phase.

In the lower half of the phase diagram, the thermal effect is represented for four different frequencies. The curve shows the path of the tip of the vector as frequency varies. At low frequencies, the phase would be nearly 180°. At high frequencies, the phase would be nearly 90° away from the phase of the carrier effect component. As can be seen, the magnitude of the thermal effect rolls off as frequency increases.

The total FM output is the vector sum of these two components. This is shown for two of the frequencies. Over a wide range of frequencies, there will be a considerable component of the vector sum in quadrature with the frequency modulation.

In FIG. 3 how far to the right the vector sum extends, indicates the magnitude of the quadrature component.

Preferably the frequency of modulation is chosen to maximise the magnitude of the quadrature component of the vector sum. This will typically occur at tens or hundreds of kHz depending on the carrier concentration variations, and thermal characteristics within the laser element. These will vary with the particular device structure used. Furthermore, the magnitude of the quadrature signal will vary with lasers of different FM to AM co-efficients. Nevertheless, these effects will not result in any offset error in the control loop as the loop simply stabilises to zero error. By detecting and using only the portion which is in quadrature to the applied modulation, offset errors caused by unwanted AM can be reduced or eliminated.

Figure 4:
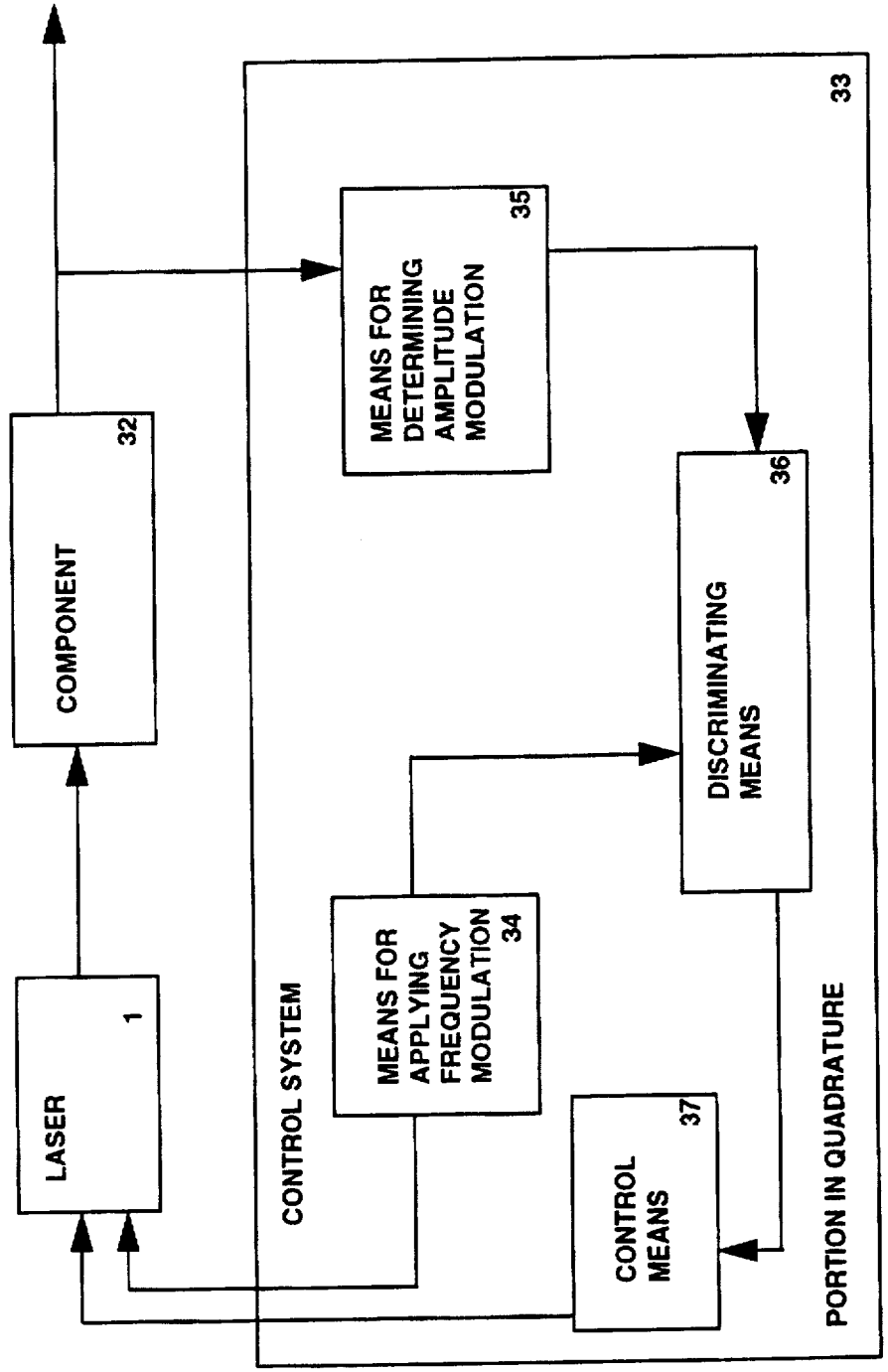
FIG. 4 shows an embodiment of the invention wherein a control system controls the laser frequency.

FIG. 4 shows in schematic form a control system according to another embodiment of the invention. It is used for controlling the frequency of a laser 1 which outputs an optical signal which is passed through a component 32. The component 32 may be a narrow band filter, or an equivalent such as a fibre grating dispersion compensator with a narrow band frequency response or a narrow band absorption gas cell for example. The steeper the slope or sharper the peak of the response of the component, the more precise is the control of the laser frequency.

The control system 33 includes means for determining amplitude modulation 35, discriminating means for discriminating a portion which is in quadrature with the applied frequency modulation, and control means 37 for controlling the output frequency of the laser on the basis of the portion in quadrature. Preferably the control means is arranged to drive the quadrature portion towards zero, to lock the laser frequency to a peak on the frequency response of the component. It could be arranged to lock onto a point of known slope, by forcing the quadrature component to a particular non zero value. This is useful for locking to one side of a filter with a flat topped response.

A means for applying frequency modulation 34 is also shown. This means also feeds the discriminating means, to enable the discriminating means to establish the portion which is in quadrature with the laser modulation.

The laser modulation could be determined from the laser optical output. However, that would require optical to electrical conversion, which would add to the hardware costs. It would be necessary if in FIG. 8 component 32 was not co-located with the laser. Provided there is little phase shift between the applied modulation signal and the laser output (which would normally be the case at the preferred frequency range where there is a significant quadrature component), it is more convenient to use the modulation signal applied to the laser to represent the laser modulation.

Figure 5:
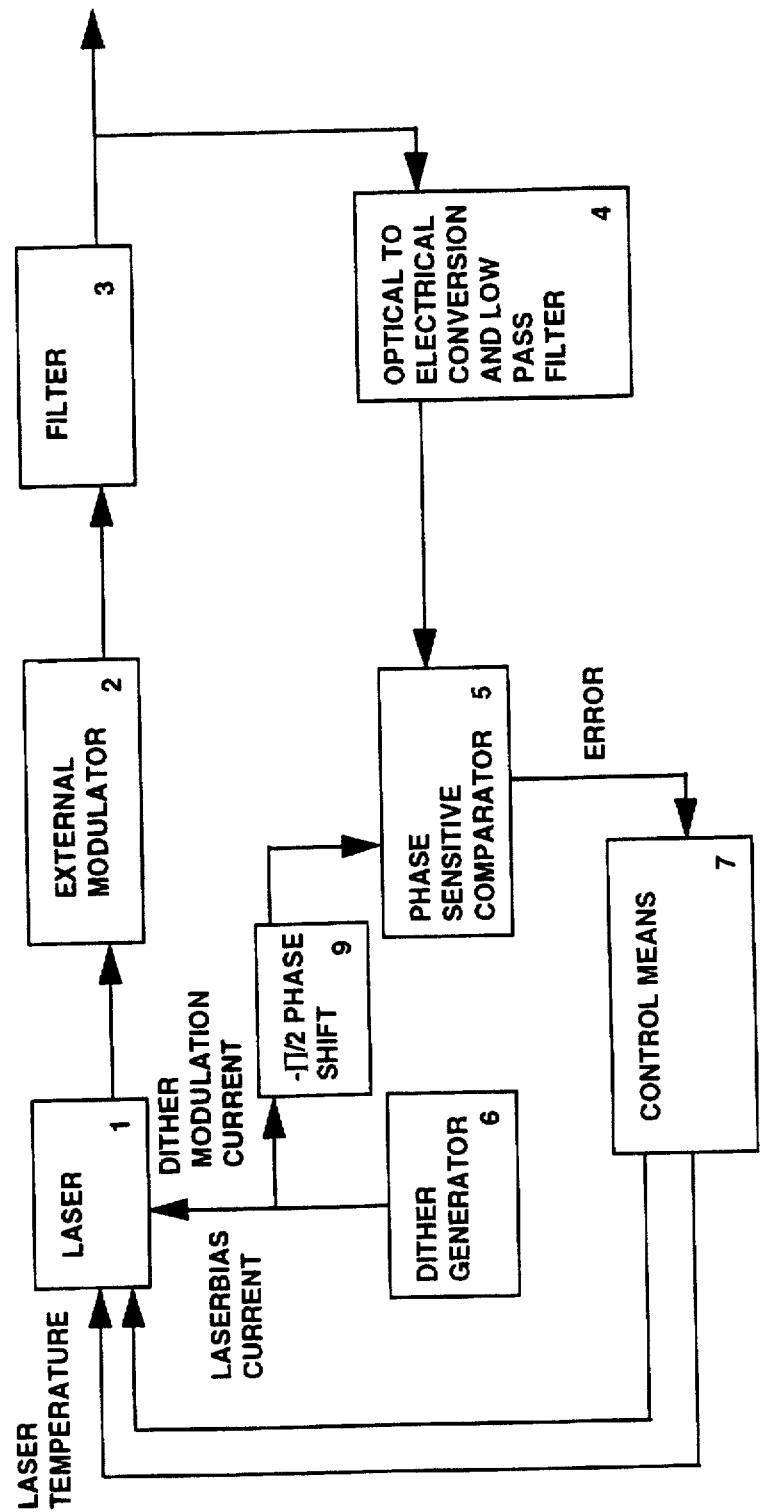
FIG. 5 shows a schematic diagram of the embodiment of FIG. 4 in more detail.

FIG. 5 shows one possible embodiment of the arrangement of FIG. 4. Here the optical component is shown as a filter 3. An external modulator 2 is also shown in the optical path. A dither generator 6 applies a modulation to the laser current, which causes the output of the laser to be amplitude and frequency modulated. The output frequency of the laser is also adjusted for offset by a temperature control means 7. The temperature control means 7 receives an error signal created by low pass filtering of the output of the phase sensitive comparator 5. This error signal is a d.c. value proportional to the amount of amplitude modulation on the output of the filter 3 which is in quadrature with the modulation applied to the laser current. The temperature control means 7 is operable to adjust the frequency of the laser 1 so as to reduce the error towards zero, or a predetermined value. The detection of the portion which is in quadrature with the applied modulation is achieved by shifting the phase of the modulation by means of the phase shift means 9. The output of this phase shift means is applied to the phase sensitive comparator 5. The phase shift means can be implemented by a phase locked loop. The phase locked loop does a synchronous detection and integrates the result, which is fed back to drive the output to zero. For a single frequency, or a sufficiently narrow band, the output will thus be in quadrature with the input. Because of the integration function, a phase locked loop can produce an output representing an average quadrature of a narrow range of frequencies. For such a range of frequencies, errors owing to different spectral components experiencing slightly different phase shifts will occur. However, the phase lock process can force the sum of such errors to zero, thus producing an averaged quadrature output.

As before, the frequency modulation on the output of the laser will cause some amplitude modulation as a result of any slope in the response of the filter 3. This amount of amplitude modulation will be detected by an optical to electrical conversion means 4, typically a PIN diode, which together with associated electrical amplification stages, will have a significant low pass filtering effect.

Figure 6:
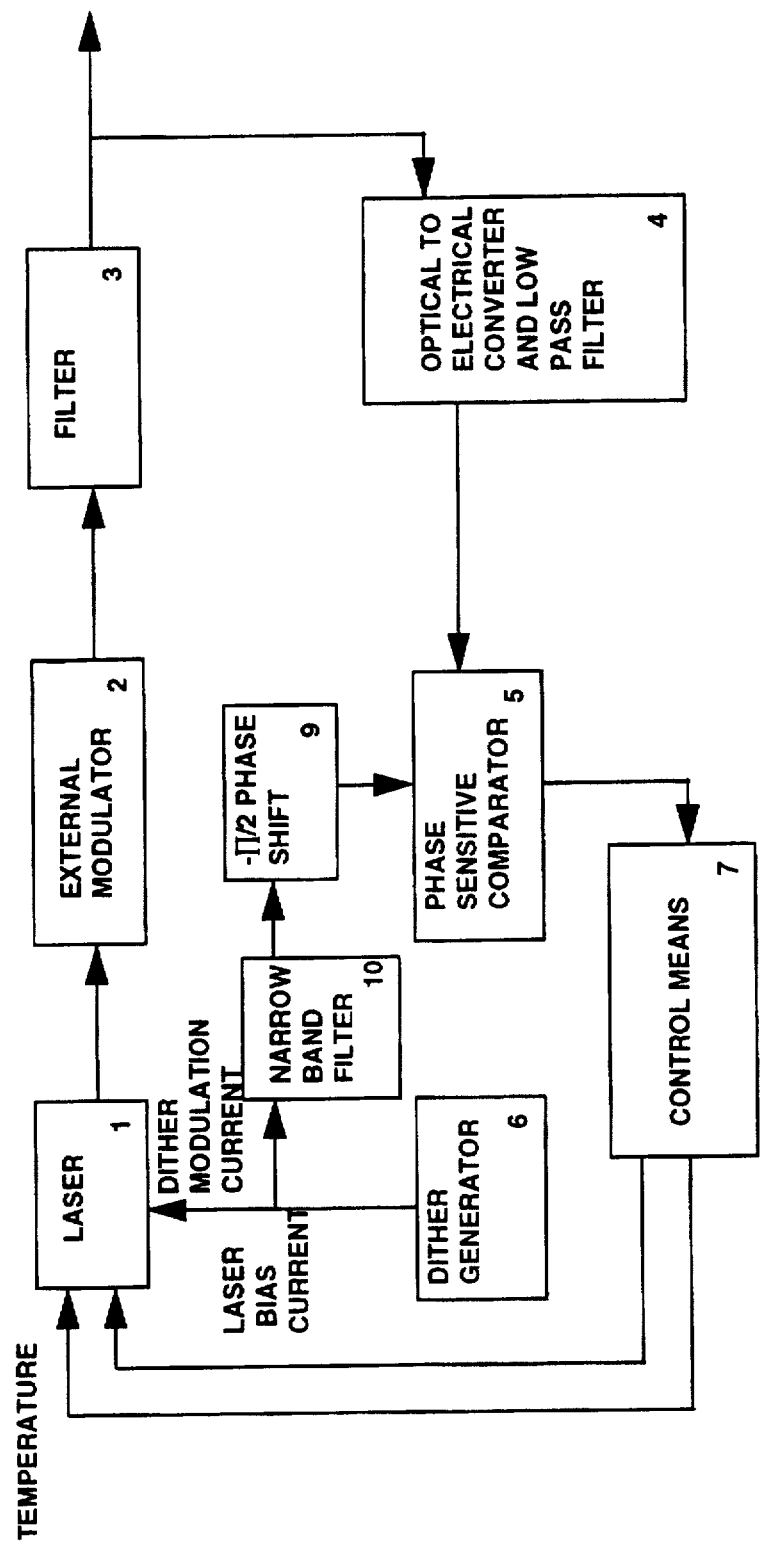
FIG. 6 shows an alternative implementation of the embodiment of FIG. 4, in schematic form.

The applied modulation generated by the dither generator 6 should be of relatively low frequency, so as to enable the control loop to be constructed more easily and cheaply. As the dither may be applied for various different purposes, there may be a range of frequencies included in the dither. Accordingly, as shown in FIG. 6, a narrow band filter 10 may be included before the dither is fed to the phase shift means 9. The selected frequency range should be a range which produces a good quadrature FM component of the applied modulation. This is likely to be in the range between 10 kHz and several 100 kHz. If only a narrow band within this range is selected, the operation of the phase sensitive comparator 5 will be enhanced, because the quadrature condition can be established more accurately.

Figure 7:
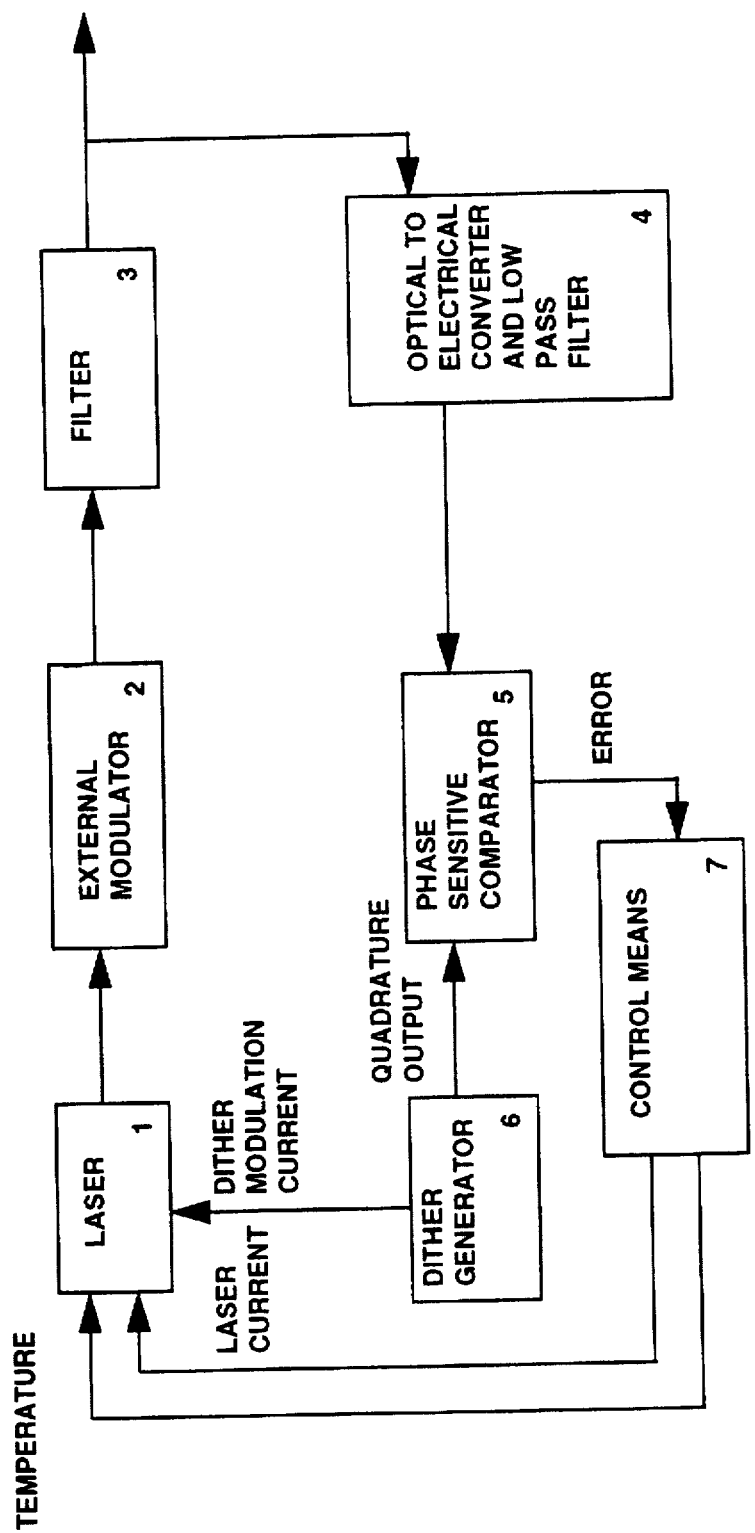
FIG. 7 shows a further alternative implementation of the embodiment of FIG. 4, in schematic form.

A further alternative is shown in FIG. 7. Here a quadrature output of the dither generator 6 is fed directly to the phase sensitive comparator 5. This removes the need for a phase shifting means such as a phase locked loop, and any preceding filter. The dither generator may be an oscillator which produces a sine or square wave dither. In this case it is straightforward to produce quadrature signals by dividing down a higher rate oscillator. Alternatively, the generator may produce a more complex data pattern. For example, a miller encoded binary pattern may be appropriate for the modulation, in which case either a signal can be generated in quadrature to this data pattern, with a spectral content over the appropriate range of frequencies, or a 50% duty cycle sine or square wave signal may be generated which is in quadrature to one dominant spectral line of the data pattern. If short length patterns are used, there should be a sufficiently dominant spectral line from which to derive a signal in quadrature.

Figure 8:
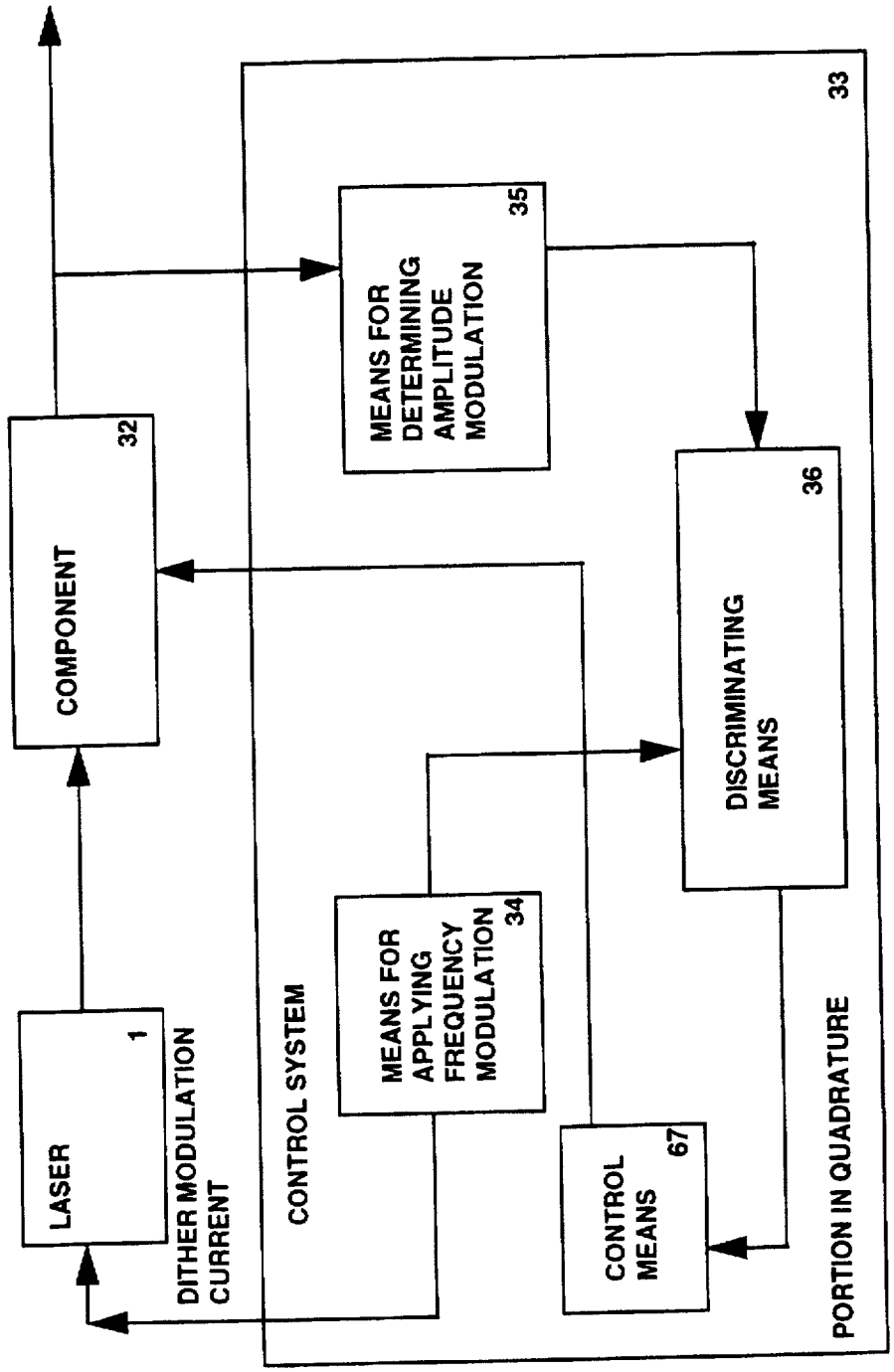
FIG. 8 shows another embodiment of the invention in schematic form, illustrating control of a tuneable component.

FIG. 8 shows another embodiment of the invention in schematic form. This differs from the embodiment shown in FIG. 4 in that a control means 67 is provided to adjust the frequency response of the component 32, rather than the output frequency of the laser 1. The dither is still applied to the laser 1 by a means for applying frequency modulation 34. Likewise, the control means 67 is also operable in response to a portion of the determined amplitude modulation which is in quadrature to the applied laser modulation. The control means 67 is operable to adjust the frequency response of the component 32 so as to reduce the quadrature portion towards zero. This enables the frequency response of the component to be locked to the output frequency of the laser 1.

In all these cases, the frequency variation of the laser output will be very small, typically a few GHz.

Figure 9:
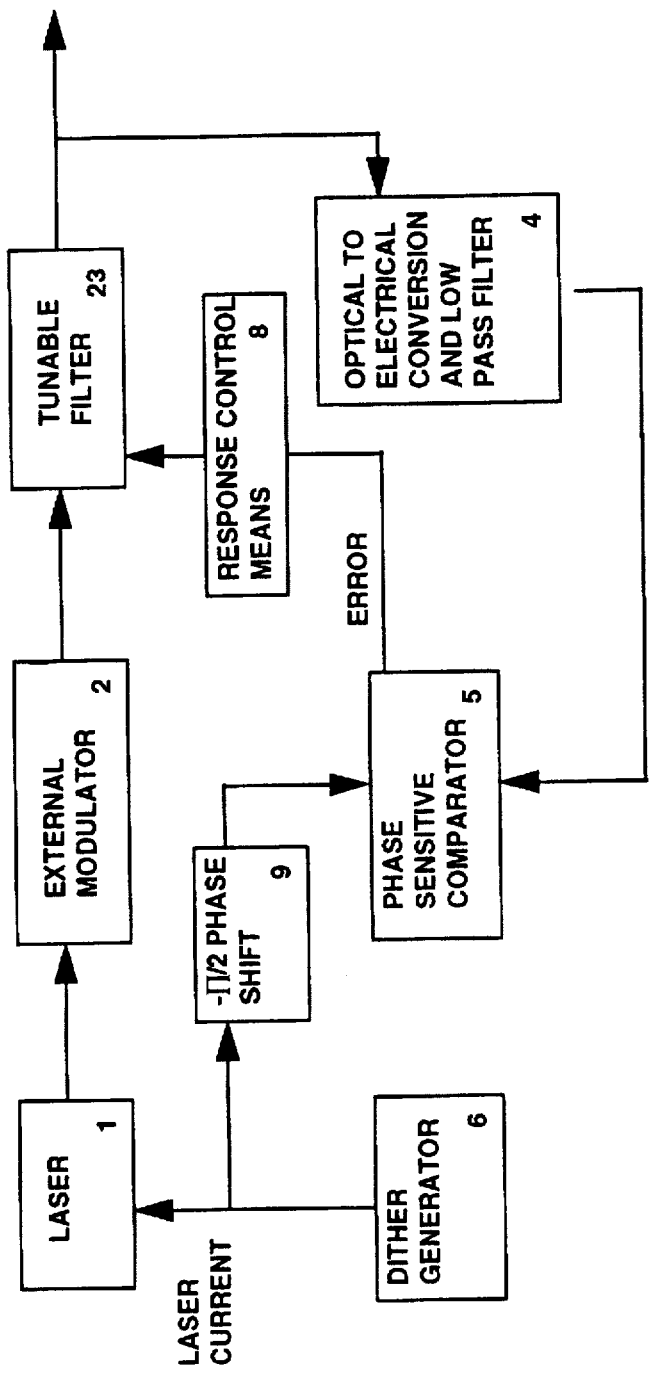
FIG. 9 shows in schematic form a possible implementation of the embodiment of FIG. 8.

In FIG. 9, the response control means 8 is provided to carry out the function of the control means 67 shown in FIG. 8. This drives the tuneable filter 23 so as to reduce the quadrature portion, or error signal, output by the phase sensitive comparator 5, towards zero. In practice, such a control means could be implemented by a digital micro processor. Likewise, the temperature compensation generator 7 could be implemented by a digital micro processor with stored programmes to run appropriate control algorithms.

The phase sensitive comparator 5 could be implemented by conventional analogue circuitry, or in principle, in digital form by a micro processor or a digital signal processor.

The optical component, or the means for determining amplitude modulation in the signal downstream of the laser need not be near the control system or near the laser. Thus a filter remote from the laser may be used to control the laser frequency. Furthermore, a tuneable filter located away from the laser may be controlled on the basis of the control system described above using a dither applied to the remote laser. In this case it would be preferable to derive a signal representing the laser amplitude modulation at the remote site, by tapping the input to the remote filter. This could be fed to the quadrature detector after phase shifting as described in relation to FIG. 5.

Other variations may be envisaged which fall within the scope of the claims. While the invention is particularly applicable to a control system, other uses can be envisaged where the dither signal is used for other purposes and where it is desirable to filter out unwanted AM introduced by the laser 1 or other elements in the optical path.

We claim:

1. A control system for controlling the frequency of a laser in an optical transmission system in which the optical output of the laser is passed through an optical component whose output amplitude is dependent on input frequency and input amplitude, the control system comprising:

means for applying a modulation to the laser which produces frequency modulation and amplitude modulation in an optical output of the laser;

means for detecting an amplitude modulation present at the output of the component;

means for determining a portion of the detected amplitude modulation which is substantially in phase quadrature with the amplitude modulation in the optical output of the laser; and means for controlling the frequency of the laser on the basis of the quadrature portion.

2. The control system of claim 1 wherein the frequency modulation is applied by direct modulation of the laser current.

3. The control system of claim 1 wherein the determining means comprises means for phase sensitive comparison of the laser amplitude modulation and the detected amplitude modulation.

4. The control system of claim 3 further comprising means for phase shifting the laser amplitude modulation or the detected amplitude modulation relative to the other, before input to the phase sensitive comparison means.

5. The control system of claim 4 wherein the means for applying a frequency modulation comprises a dither oscillator, which is operable to output a quadrature signal for input to the phase sensitive comparison means, to achieve the phase shift.

6. The control system of claim 1 wherein the determining means comprises means for extracting a selected frequency band and discriminating the portion from the selected frequency band.

7. The control system of claim 1 wherein the means for detecting the amplitude modulation is operable on the basis of a part of the input signal which is rejected by the component.

8. The control system of claim 1 wherein the means for detecting the amplitude modulation is remote from the laser.

9. The control system of claim 1 wherein the frequency of the frequency modulation is determined so as to maximise the quadrature portion.

10. The control system of claim 1 wherein the control means is operable to maintain a constant relationship between the frequency of the laser and the frequency response of the component.

11. An optical transmission system comprising a laser, an optical component downstream of the laser, and the control system of claim 1, for controlling the frequency of the laser.

12. A control system for controlling the frequency response of an optical component downstream of a laser in an optical transmission system, an output amplitude of the component being dependent on input amplitude and input frequency, the control system comprising:

means for applying a modulation to the laser which produces frequency modulation and amplitude modulation in an optical output of the laser;

means for detecting an amplitude modulation present at the output of the component;

means for determining a portion of the detected amplitude modulation which is substantially in phase quadrature with the amplitude modulation in the optical output of the laser; and means for controlling the frequency response of the component on the basis of the quadrature portion.

13. The control system of claim 12 wherein the control means is operable to lock a centre frequency of the component frequency response to a centre frequency of the laser.

14. The control system of claim 12 wherein the component performs a narrowband filtering function.

15. The control system of claim 12 wherein the component has a dispersion compensation characteristic.

16. A method of controlling the frequency of a laser in an optical transmission system in which the optical output of the laser is passed through an optical component having an output amplitude dependent on input frequency and input amplitude, the method comprising the steps of:

applying a modulation to the laser which produces frequency modulation and amplitude modulation in an optical output of the laser;

detecting an amplitude modulation present at the output of the component;

determining a portion of the amplitude modulation which is substantially in phase quadrature with the amplitude modulation in the optical output of the laser; and controlling the frequency of the laser on the basis of the quadrature portion.

17. A method of transmitting information in an optical transmission system comprising a laser, wherein the laser is controlled according to the method of claim 16.

18. A method of controlling the frequency response of an optical component downstream of a laser in an optical transmission system, wherein an output amplitude of the component is dependent on input frequency and input amplitude, the method comprising the steps of:

applying a modulation to the laser which produces frequency modulation and amplitude modulation in an optical output of the laser;

detecting an amplitude modulation present at the output of the component;

determining a portion of the amplitude modulation which is substantially in phase quadrature with the amplitude modulation in the optical output of the laser; and controlling the frequency response of the component on the basis of the discriminated portion.

19. A method of transmitting information in an optical transmission system comprising a laser and an optical component downstream of the laser, wherein the component is controlled according to the method of claim 18.

20. A method of maintaining a constant relationship between the frequency of a laser and the frequency response of an optical component downstream of the laser in an optical transmission system, by controlling the laser by the method of claim 16.

21. A method of maintaining a constant relationship between the frequency of a laser and the frequency response of an optical component downstream of the laser in an optical transmission system, by controlling the component according to the method of claim 18.

22. A signal processing system for processing a signal downstream of a laser in an optical transmission system in which a frequency modulation is applied to the laser output, the processing system comprising:

means for determining the amplitude modulation present in the signal and attributable to the applied frequency modulation;

means for determining a portion of the amplitude modulation which is substantially in phase quadrature with the applied frequency modulation and means for recovering a signal proportional to the applied frequency modulation based on the portion of the amplitude modulation which is substantially in phase quadrature therewith, the signal indicating the effect of the applied frequency modulation on the laser output.

23. A method of processing a signal downstream of a laser in an optical transmission system in which a frequency modulation is applied to the laser output, the method comprising the steps of:

determining the amplitude modulation present in the signal and attributable to the applied frequency modulation;

determining a portion of the amplitude modulation which is substantially in phase quadrature with the applied frequency modulation; and recovering a signal proportional to the applied frequency modulation based on the portion of the amplitude modulation which is substantially in phase quadrature therewith, the signal indicating the effect of the applied frequency modulation on the laser output.

24. An optical processor for a laser, comprising:

means for applying a modulation to the laser to induce at least one of a frequency modulation and an amplitude modulation in an optical output of the laser;

means responsive to said applying means for determining amplitude modulation of the optical output of the laser;

means for discriminating a portion of the determined amplitude modulation substantially in phase quadrature with the applied modulation; and means for recovering a signal proportional to the applied frequency modulation using the discriminated portion of the determined amplitude modulation.

25. An optical processing method for a laser, comprising the steps of:

applying a modulation to the laser to induce at least one of a frequency modulation and an amplitude modulation in an optical output of the laser;

determining amplitude modulation of the optical output of the laser;

discriminating a portion of the determined amplitude modulation substantially in phase quadrature with the applied modulation; and recovering a signal proportional to the applied frequency modulation using the discriminated portion of the determined amplitude modulation.

* * * * *